United States Patent
Wan et al.

(10) Patent No.: US 9,683,286 B2
(45) Date of Patent: Jun. 20, 2017

(54) INCREASED POLYSILICON DEPOSITION IN A CVD REACTOR

(75) Inventors: Yuepeng Wan, Nashua, NH (US); Santhana Raghavan Parthasarathy, Nashua, NH (US); Carl Chartier, Manchester, NH (US); Adrian Servini, Chesterfield, MO (US); Chandra P. Khattak, Danvers, MA (US)

(73) Assignee: GTAT Corporation, Merrimack, NH (US)

( * ) Notice: Subject to any disclaimer, the term of this patent is extended or adjusted under 35 U.S.C. 154(b) by 1161 days.

(21) Appl. No.: 11/413,425

(22) Filed: Apr. 28, 2006

(65) Prior Publication Data

US 2007/0251455 A1 Nov. 1, 2007

(51) Int. Cl.
*C23C 16/00* (2006.01)
*C23C 16/24* (2006.01)
*C01B 33/035* (2006.01)
*C23C 16/44* (2006.01)
*C23C 16/458* (2006.01)

(52) U.S. Cl.
CPC ............ *C23C 16/24* (2013.01); *C01B 33/035* (2013.01); *C23C 16/4418* (2013.01); *C23C 16/458* (2013.01); *Y10T 117/10* (2015.01); *Y10T 117/102* (2015.01); *Y10T 117/104* (2015.01);
(Continued)

(58) Field of Classification Search
USPC ......................................................... 118/724
See application file for complete search history.

(56) References Cited

U.S. PATENT DOCUMENTS 3,006,737 A 10/1961 Moates et al.
3,030,189 A * 4/1962 Emeis et al. .................... 117/33
(Continued)

FOREIGN PATENT DOCUMENTS

DE 2447691 A1 4/1976
GB 717408 10/1954
(Continued)

OTHER PUBLICATIONS

PCT Search Report dated Sep. 1, 2008 of Patent Application No. PCT/US07/66923 filed Apr. 19, 2007.
(Continued)

*Primary Examiner* — Keath Chen
(74) *Attorney, Agent, or Firm* — Maine Cernota & Rardin

(57) ABSTRACT

A method and process for the production of bulk polysilicon by chemical vapor deposition (CVD) where conventional silicon "slim rods" commonly used in Siemens-type reactors are replaced with shaped silicon filaments of similar electrical properties but larger surface areas, such as silicon tubes, ribbons, and other shaped cross sections. Silicon containing gases, such as chlorosilane or silane, are decomposed and form a silicon deposit on the hot surfaces of the filaments The larger starting surface areas of these filaments ensures a higher production rate without changing the reactor size, and without increasing the number and length of the filaments. Existing reactors need only the adaptation or replacement of filament supports to use the new filaments. The filaments are grown from silicon melt by Edge-defined, Film-fed Growth (EFG) method. This also enables the doping of the filaments and simplification of power supplies for new reactors.

12 Claims, 8 Drawing Sheets

(52) U.S. Cl.
CPC .... *Y10T 117/1024* (2015.01); *Y10T 117/1032* (2015.01)

(56) References Cited

U.S. PATENT DOCUMENTS

| | | | |
|---|---|---|---|
| 3,120,451 A | 2/1964 | Schmidt et al. | |
| 3,293,950 A | 12/1966 | Kern et al. | |
| 3,729,335 A | 4/1973 | Domrachev et a. | |
| 3,746,496 A | 7/1973 | Dietze et al. | |
| 3,781,152 A | 12/1973 | Keller et al. | |
| 3,853,974 A | 12/1974 | Reuschel et al. | |
| 3,915,662 A | 10/1975 | Labelle et al. | |
| 4,062,714 A | 12/1977 | Griesshammer et al. | |
| 4,123,989 A | 11/1978 | Jewett | |
| 4,125,643 A * | 11/1978 | Reuschel et al. | 427/9 |
| 4,131,659 A | 12/1978 | Authier et al. | |
| 4,148,931 A | 4/1979 | Reuschel et al. | |
| 4,230,674 A | 10/1980 | Taylor et al. | |
| 4,265,859 A | 5/1981 | Jewett | |
| 4,292,264 A | 9/1981 | Cota et al. | |
| 4,481,232 A | 11/1984 | Olson | |
| 4,653,428 A | 3/1987 | Wilson et al. | |
| 4,681,652 A | 7/1987 | Rogers et al. | |
| 4,711,695 A | 12/1987 | Stormont et al. | |
| 4,981,102 A | 1/1991 | Gautreaux et al. | |
| 5,277,934 A | 1/1994 | Gilbert et al. | |
| 5,499,598 A | 3/1996 | Oda | |
| 5,534,314 A * | 7/1996 | Wadley et al. | 427/585 |
| 5,547,717 A | 8/1996 | Scaringella et al. | |
| 5,552,039 A | 9/1996 | McBrayer, Jr. et al. | |
| 5,593,465 A | 1/1997 | Seifert et al. | |
| 6,284,312 B1 | 9/2001 | Chandra et al. | |
| 6,350,313 B2 | 2/2002 | Kraus et al. | |
| 6,365,225 B1 * | 4/2002 | Chandra et al. | 427/237 |
| 6,581,415 B2 * | 6/2003 | Chandra et al. | 65/66 |
| 6,639,192 B2 | 10/2003 | Hertlein et al. | |
| 6,814,802 B2 | 11/2004 | Wallace, Jr. | |
| 6,861,144 B2 | 3/2005 | Wakamatsu et al. | |
| 2002/0014197 A1 * | 2/2002 | Keck et al. | 117/87 |
| 2007/0251447 A1 | 11/2007 | Muller et al. | |

FOREIGN PATENT DOCUMENTS

| | | |
|---|---|---|
| JP | S5015478 A | 4/1973 |
| JP | S4844159 A | 6/1973 |
| JP | S5018503 A | 2/1975 |
| JP | S51103875 | 9/1976 |
| JP | S5237523 A | 3/1977 |
| JP | 2003522716 A | 7/2003 |
| JP | 2004-149324 | 5/2004 |
| JP | S496463 B | 2/2014 |
| WO | 2006/018100 A1 | 2/2006 |
| WO | 2006110481 | 10/2006 |

OTHER PUBLICATIONS

European Supplementary Search Report for Application No. 07760879.2, Feb. 15, 2010, 9 pages.

European Search Report for Application No. 12182264, Jul. 5, 2013, 5 pages.

Almeida, E.C. et al., Structural and voltammetic studies at boron-doped diamond electrode grown on carbon felt produced from different temperatures, Diamond & Related Materials 14 (2005) 679-684, available online at www.sciencedirect.com.

* cited by examiner

INCREASED POLYSILICON DEPOSITION IN A CVD REACTOR

FIELD OF INVENTION

This invention relates to the chemical vapor deposition of silicon, and more particularly to the use of shaped silicon filaments with larger starting surface areas for deposition than traditional solid slim rods, in CVD reactors of the same general design.

BACKGROUND OF THE INVENTION

Use of polysilicon by the photovoltaic industry has been growing rapidly and in 2005 this demand was essentially equivalent to the use of polysilicon by the microelectronic industry. The anticipated growth rate of the photovoltaic industry is expected to be between 15 to 30% (recent year growth has been at 30 to 45%) compared to the microelectronic industry at 7 to 10% which will result in much larger demand of polysilicon for the photovoltaic industry. While the silicon wafer cost constitutes approximately 25 to 33% of the PV (photovoltaic) module costs, it is less than 5% of the silicon semiconductor device costs in the microelectronic industry. Therefore, it is imperative to reduce the cost contributions of polysilicon for the photovoltaic industry. The PV industry has learned to use polysilicon with minor imperfections and slight contamination as one way to contain costs.

One of the most widely practiced conventional methods of polysilicon production is by depositing polysilicon in a chemical vapor deposition (CVD) reactor, and is referred to as Siemens method. Referring to prior art FIG. 1, a CVD reactor consists of a base plate 23, chamber wall or quartz bell jar 17. There is incorporated in base plate 23, a gas inlet 20 and a gas outlet 21 (can be in the same position), and electrical feedthroughs 19. A viewing port 22 provides for visual inspection of the interior or for the temperature measurement.

In the prior art polysilicon manufacturing by CVD, a high-purity silicon slim rod structure or filament is assembled in the form of a hair pin by having a cross rod 2 placed horizontally on two long, spaced apart, vertical rods 1 and 3. This structure is mounted and connected so as to provide a current path between electrical feedthroughs 19. During the CVD process, polysilicon deposit accumulates uniformly on the slim rods; the deposit 41 being shown here partially removed to show the slim rod structure. Different users employ different methods for joining the horizontal rod to the vertical rods. One method requires a groove or a key slot at the top of each vertical rod. A small counter bore or conforming fitment is formed at the ends of the horizontal rod so that it can be press fitted into the grooves to bridge the two vertical rods.

Because of the high purity silicon from which these rods are fabricated, the corresponding electrical resistance of the slim rods is extremely high. Thus it is extremely difficult to heat this silicon "filament" using electrical current, during the startup phase of the process.

Sometimes the slim rods are replaced by metallic rods that are more conductive and easier to heat with electrical current. This method is referred to as Rogers Heitz method. However, the introduction of metal into the chemical vapor deposition process can introduce metal contamination. This contamination of the polysilicon yield is not acceptable in the semiconductor/microelectronics industry. However, for the photovoltaic industry the wafers used for fabricating solar cells are typically doped with Periodic Table group 3 elements, such as boron (B), or group 5 elements, such as phosphorous (P), to make them more conductive.

Resistivity of pure silicon is a strong function of temperature, ranging from $10^6$ ohm.cm for a slim rod at room temperature to 0.01 ohm.cm at 1200 deg C. Doped silicon, however shows a different behavior. Depending on the concentration of the dopant, e.g, Boron, the resistivity will increase along with the temperature to a certain point, and then become the same as an intrinsic silicon slim rod. At room temperature, a boron doped silicon slim rod at $10^{18}$ atom/cm$^3$ is about 0.05 ohm.cm. There is some tolerance for impurities, especially for the dopant ions, when polysilicon is used for photovoltaic applications.

A typical prior art reactor for conducting a Siemens-type process includes a complex array of subsystems. External heaters are used to raise the temperature of the high purity slim rod filaments to approximately 400° C. (centigrade) in order to reduce their electrical resistivity or impedance to current flow. Sometimes external heating is applied in form of halogen heating or plasma discharge heating. Normally, a multi-tap electrical power supply is required for the resistance heating of the filaments. It can provide very high voltages and low current for the early phase heating; and a very high current at relatively lower voltage for the later phase when the resistivity of the rods has been decreased by the higher temperature.

High voltage switching gear is needed for switching between the power level taps. The first process of sending low current at high voltage through the filaments continues until the temperature of the filaments reaches about 800° C. At this temperature, the resistance of the high purity silicon rods falls very drastically and the high voltage source is switched to the low voltage source that is capable of supplying the high current. However, since the current drawn by the silicon slim rods at around 800° C. is of a run away nature, the switching of the high voltage to low voltage power source needs to be done with extreme care and caution.

During the CVD process, silicon deposits onto the hot surface of the filaments and the diameter of the resulting silicon rods becomes larger and larger. Under the constant process conditions of gas supply, reactor pressure, the surface temperature of the growing rods (typically 1100 degrees C. for using trichlorosilane as the decomposition gas, for example), the rate of the diameter increase (or the deposition rate in terms of micrometer per minute) is more or less constant. The typical starting size of the silicon slim rods is about 7 mm with a round or square cross section. The size of the metal wire slim rods is even smaller. Therefore, the production rate in terms of kg per hour is very low at the initial stage when the silicon rod diameter is small.

In one kind of conventional CVD reactor, high purity silicon is deposited by reaction of trichlorosilane (SiHCl$_3$) and hydrogen (H$_2$) onto solid slim rods of typically 7 mm diameter. In a typical reactor an array of slim rods are assembled; this placement is based on radiant heat transfer between the rods, heat losses to the outside wall and deposition rate of silicon on these slim rods. Faster deposition rates can result in imperfections in polysilicon productions which is not acceptable to the microelectronics industry; however the photovoltaic industry has learned to deal with such minor imperfections.

There have been past efforts made to modifying the current CVD reactors with the intent to simplify the number of slim rods or to increase the deposition rates, but they have not achieved widespread acceptance as the new reactors deviated considerably from the conventional reactor designs and it would be very costly and time consuming to retrofit or replace existing CVD reactors and optimize all other parameters prior to commercialization.

SUMMARY OF THE INVENTION

It is an object of the present invention to increase the throughput of conventional CVD reactors by incorporating silicon shapes, such as silicon tubes, ribbons, or other large surface area filament shapes of similar electrical properties, instead of the conventional solid slim rods, so that the initial surface area for deposition of silicon is increased. For example, using a tubular silicon filament of 50 mm diameter rather than the conventional slim rod, the production throughput can be increased by 30-40% without compromising the quality of the product and without significant changes to the reactors. The required change to the reactor design to use the alternative filament is so minor that it can be retrofitted to current CVD reactors quickly and at very modest cost. It can even more easily be incorporated into new reactors of the same basic design, with further cost reduction benefits.

Another object of the present invention is to increase the throughput by use of silicon filament shapes with larger surface areas, with minimum changes of the existing Siemens reactors designed for silicon slim rods as the filaments. By choosing the appropriate cross section area of the new filaments, the high voltage needed for launching the filament heating will be the same as that used for the slim rod filaments. Therefore, the same power supplies, which are expensive components of the reactor system, can be used. This makes the retrofit of existing reactors to use filaments of the invention attractive.

An additional object of the invention is to provide a guideline for choosing an appropriate starting diameter of a tubular silicon filament, which is dependent on the downtime of the process. The process downtime is defined as the time between the shut down of power for the deposition cycle (end of the deposition) to the start of passing silicon containing gases in the next run. The downtime includes cooling down of the reactor, purging of the reacting gases, removing of the products, cleaning of the reactor, mounting of the filaments, purging of the reactor, preheating of the filaments (if needed), and heating up the filaments to the deposition temperature. The typical downtime in the production ranges from 6 to 12 hours.

Yet another object of the invention is to provide a cost-effective process for growing the silicon shapes that are useful as the large surface area filaments having suitable deposition and electrical properties. By applying the well-established EFG method and appropriate dies, different sizes and cross section shapes of silicon filament stock can be grown continuously at a fast rate.

Still another object of the invention is to disclose a high-throughput method for growing the silicon shapes by growing multiple lengths of filament stock from the same melt reservoir at the same time using multiple dies or a multi-cavity die of the desired cross section shape, size and wall thickness.

An additional object of the invention is to disclose a method for growing highly doped shaped filaments such as the tubular filaments disclosed. The filaments can be doped either p-type or n-type. As noted previously, the use of the doped filaments can eliminate the need of a preheating of the starting filaments by an external heating source, and reduce the voltage needed for launching the heating of the filaments by the passing the electric current directly through the filaments. Such doped filaments enable simplification of the power supply and control circuit and reduce the cost of the subsystems for the CVD reactor. It also reduces the time needed for heating up the filaments.

The invention is especially beneficial when using doped silicon filaments in the case of building new Siemens-type reactors. The power supplies can be greatly simplified without the requirement of high voltage (several thousand volts for the launching stage), and the cost of the power supply, which is a major cost component of the reactor equipment, can be significantly reduced.

In summary, the invention of making and adapting relatively large surface area filaments of similar electrical properties to traditional slim rods, to reactors designed for and used with slim rods, contributes to cost reductions in both the cost to update existing reactors and the capital cost of new reactors by enabling the use of substantially similar reactor designs but with important cost savings in specific high-cost components; and to higher yields and lower per unit costs.

DETAILED DESCRIPTION OF THE INVENTION

The invention is susceptible of many variations in form and practice. Accordingly, the figures and following description of embodiments of the invention are to be regarded as illustrative in nature, and not as restrictive.

Figure 1:
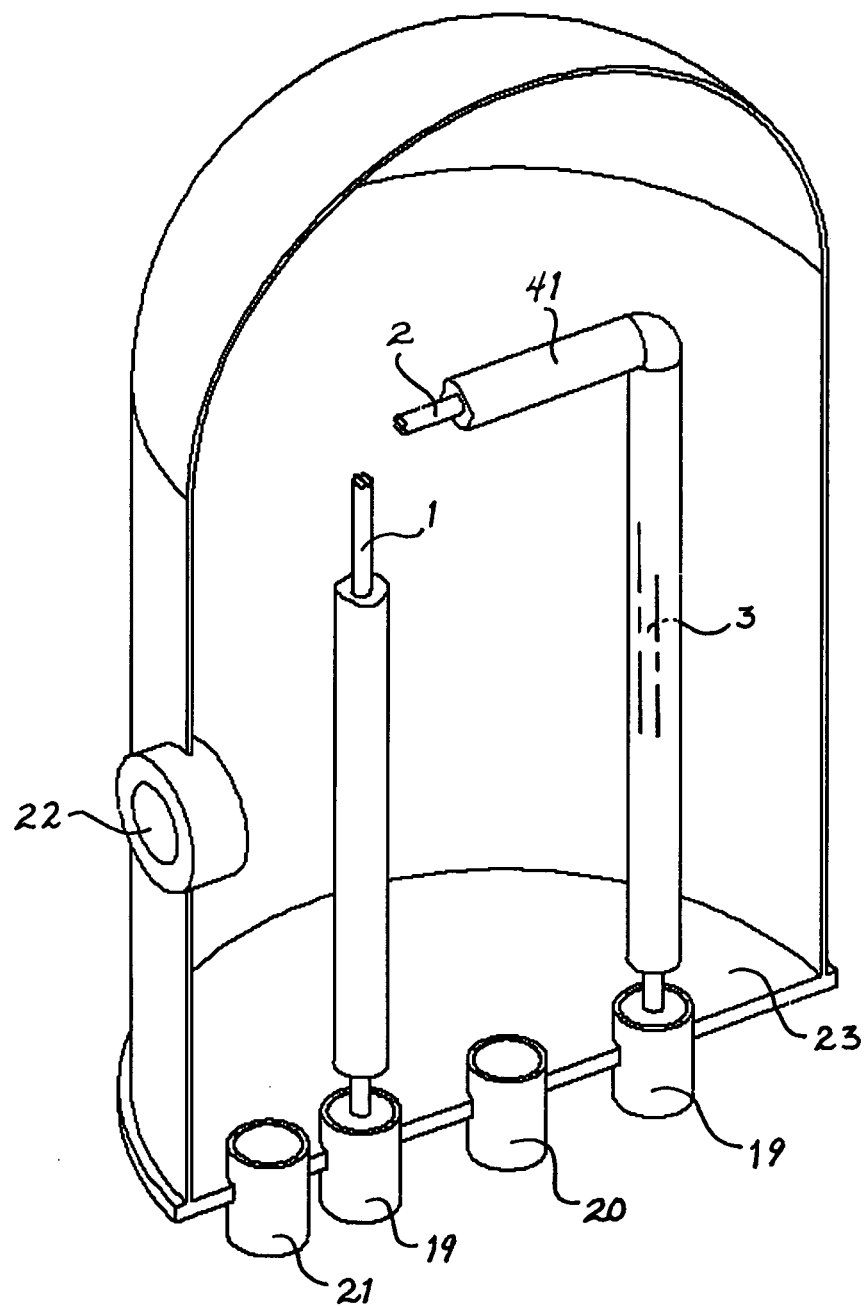
FIG. 1 is a cut away perspective view of a prior art chemical vapor deposition (CVD) reactor utilizing a slim rod filament as the target upon which a coating or layer of polysilicon has been deposited by operation of the Siemens Process within the reactor.
Figure 2:
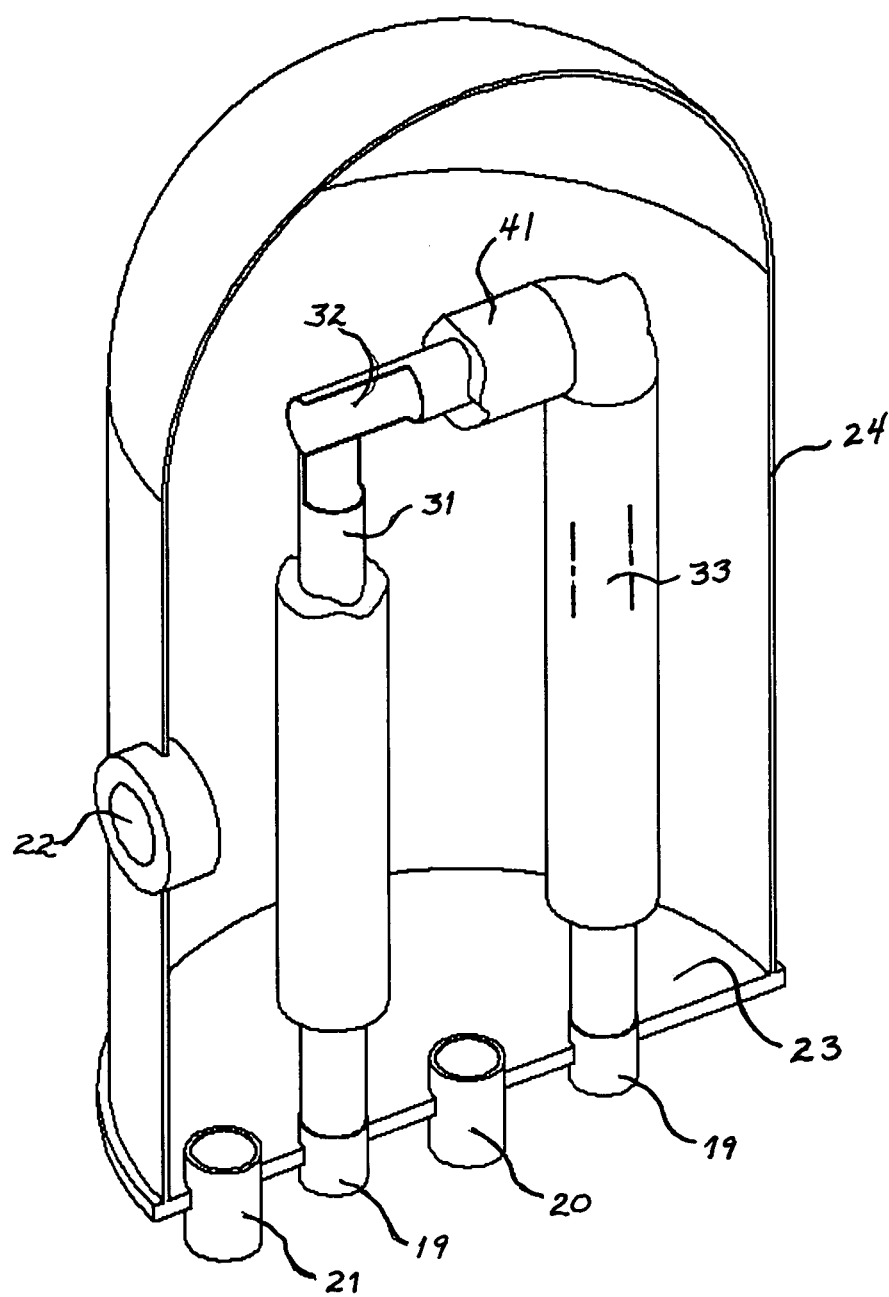
FIG. 2 is a cut away perspective view of a chemical vapor deposition reactor within which a thin wall polysilicon structure of substantially greater initially exposed surface area replaces the slim rod of FIG. 1, and upon which a coating or layer of silicon has been deposited by operation of the Siemens Process within the reactor.
Figure 3A:
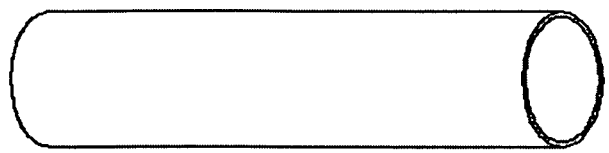
FIGS. 3A, 3B, 3C, and 3D are examples of silicon filaments of various cross sections suitable for use in the reactor of FIG. 2.
Figure 3B:
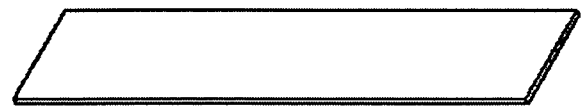
Figure 3C:
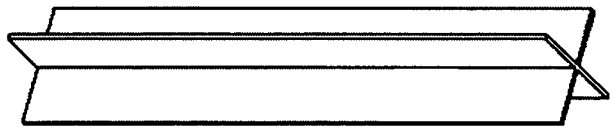
Figure 3D:
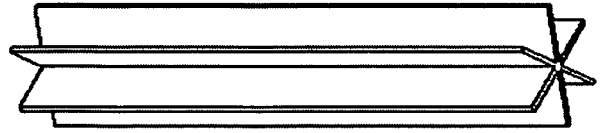

According to one embodiment of the invention, shaped silicon filaments are used to replace the conventional slim rods in a CVD reactor for making polysilicon. Referring to FIG. 2, one embodiment of the invention utilizes a silicon tube filament the length of which is divided into segments 31, 32, 33 as the starting filament shape in a CVD reactor adapted accordingly, replacing the silicon slim rods 1, 2, and 3 of FIG. 1 in the analogous conventional CVD reactor. Filament segments of other cross section shapes, where the shape yields a significantly larger available surface area for deposition than a solid core slim rod, are within the scope of the invention. Filament segments may be of a mix of cross section shapes, such as a flat or ribbon filament bridge segment connecting tubular or star shaped vertical segments, so long as their deposition and electrical properties are consistent.

By selecting an appropriate wall thickness and cross section area of the silicon filament segment, the electrical resistance characteristics can by design approximate those of a slim rod filament. This allows the power supply that was designed and used for heating the silicon slim rods of the reactor of FIG. 1 to be utilized for heating up the large surface area filaments of the FIG. 2 reactor. The current power supplies used are designed for intrinsic (high resistivity, undoped) silicon where initial heating is carried out under very high voltage. As the temperature of the slim rod is increased the resistivity of silicon drops and above about 800 C the resistivity is similar to doped silicon, much lower, and it is necessary to switch to a lower voltage. For microelectronic application where high purity is critical, undoped silicon slim rods are used; but for photovoltaic (PV) applications the silicon is intentionally doped. Therefore, doped silicon filaments can be used in accordance with the invention for PV applications without compromising purity. Such operations will no longer require a high voltage component of the power supplies, thereby simplifying the design and lowering the acquisition and operating costs of the power supply.

Using tubular silicon filaments as an example, assuming the same total length of the filaments in one current loop of a power supply as in a conventional Siemens reactor, the power needed to heat up the filament, thus the maximum voltage required at the launching stage, will be determined by the cross-section area and the circumferential or surface area of the new filaments based on the energy balance. Those skilled in the art will appreciate the mathematics required to design an alternative large surface area filament profile such as a tubular filament to have similar electrical properties as a solid rod filament. In the case of tubular filaments, in order to utilize the same power supply as used for launching and heating the slim rod filaments, the thickness and the outer diameter (OD) of the tubular silicon filaments must satisfy the relationship:

$$4(d_o-\delta)\delta > d_o d_{slim} \quad (1)$$

Where, $d_o$ is the OD (outer diameter) of the tubular filament, $\delta$ is the thickness of the tube, and $d_{slim}$ is the diameter of the conventional slim rods.

Figure 4A:
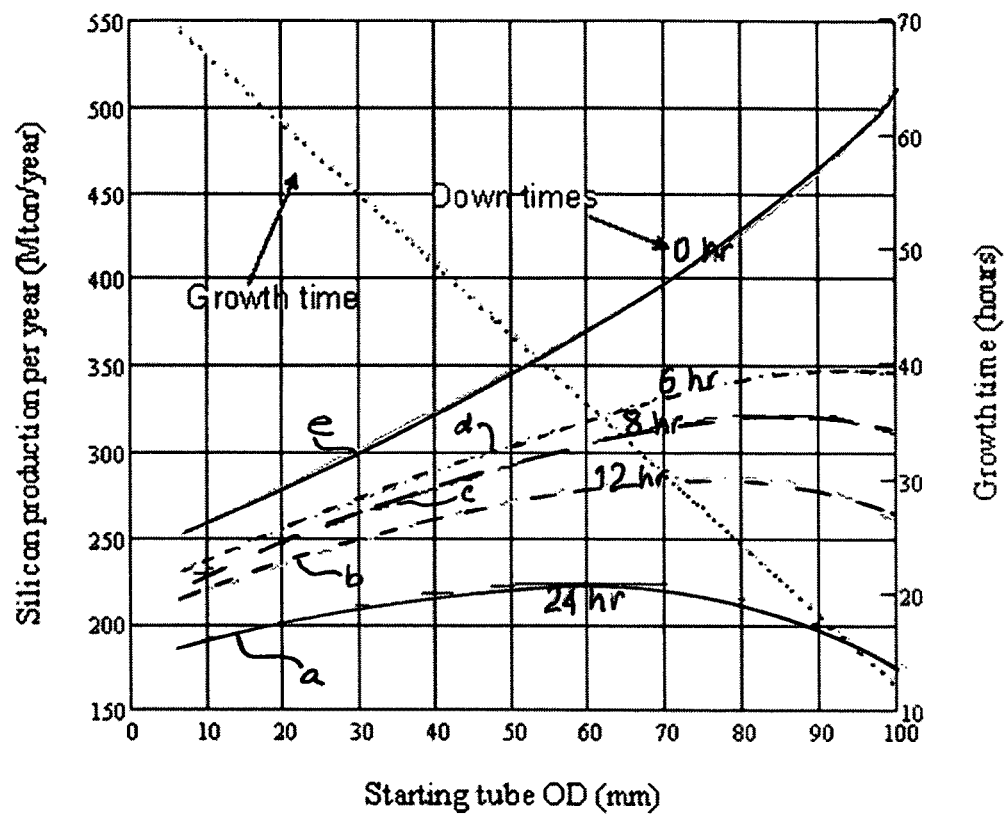
FIG. 4A is a graph of estimated polysilicon production, annual throughput, as a function of silicon tube filament outer diameters, by assuming different downtimes.
Figure 4B:
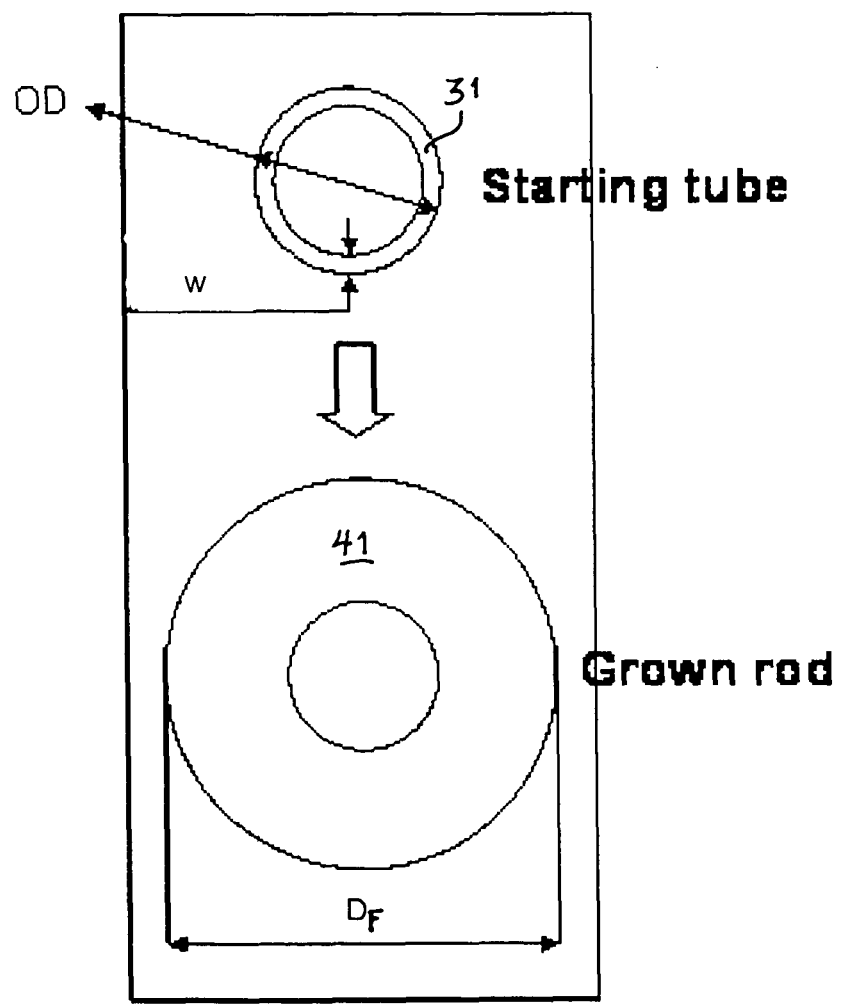
FIG. 4B is a cross section illustration of a tube filament, shown both at start up having a 2 millimeter wall thickness, and at completion having grown by deposition to 120 millimeter diameter.
Figure 5:
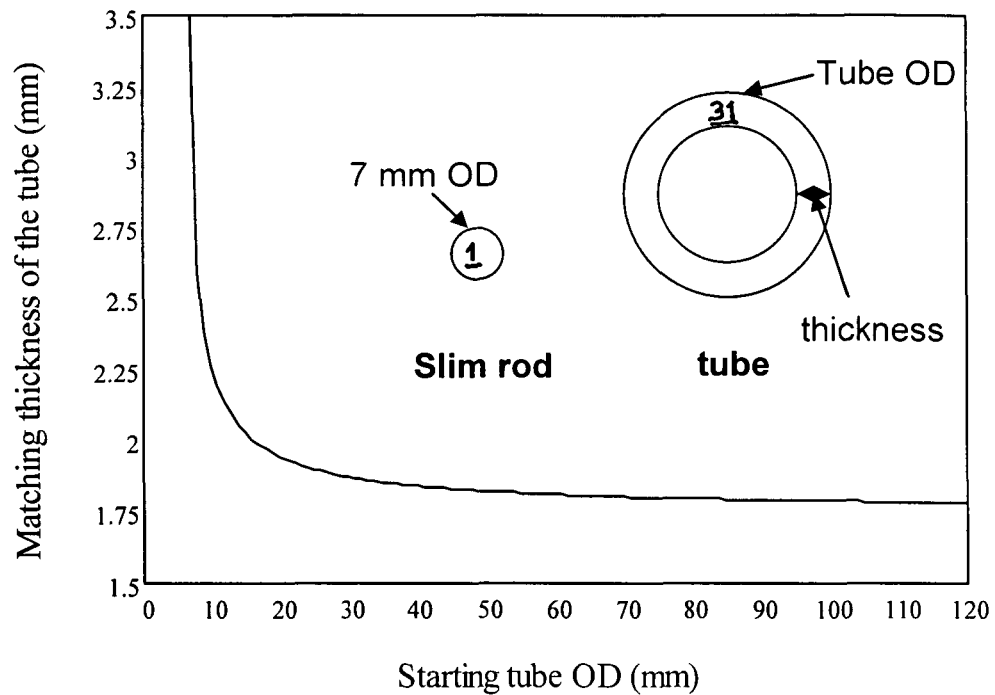
FIG. 5 is a graph for selecting a suitable wall thickness of the tube in millimeters and starting tube diameter in millimeters for a tubular filament of the invention.

Therefore, depending on the diameter of the starting tubular silicon filament, the wall thickness $\delta$ reference W of the silicon tube 31 of FIG. 4B, should he larger than a specific value as depicted in FIG. 5. For example, if the starting silicon tube OD is 50 mm, the appropriate thickness of such tubular filaments will he about 1.8 mm or more in order to use the same power supply as would be used for slim rod filaments of 7 mm diameter.

Figure 6:
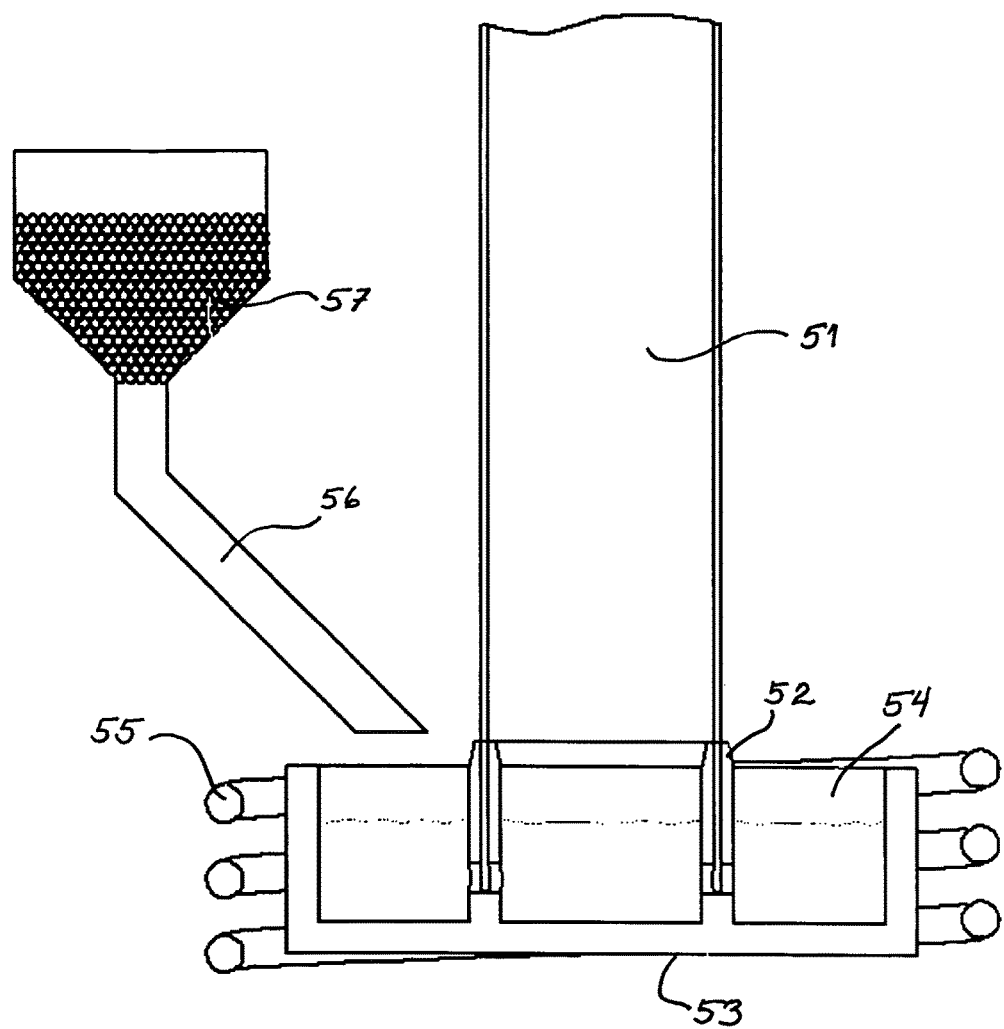
FIG. 6 is a simplified cross section view of a method and apparatus for growing silicon shapes as filaments for the reactor of FIG. 2.
Figure 7A:
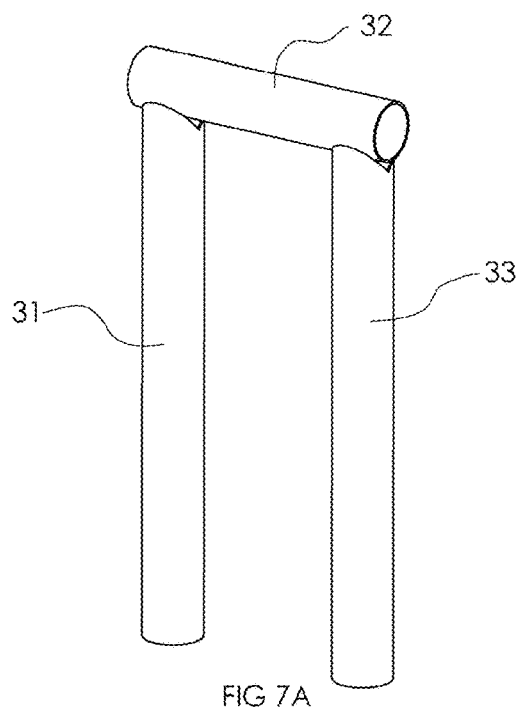
FIGS. 7A, 7B and 7C are partial perspective views of alternative filament configurations illustrating different cross section profiles for the bridge segment of the filament.
Figure 7B:
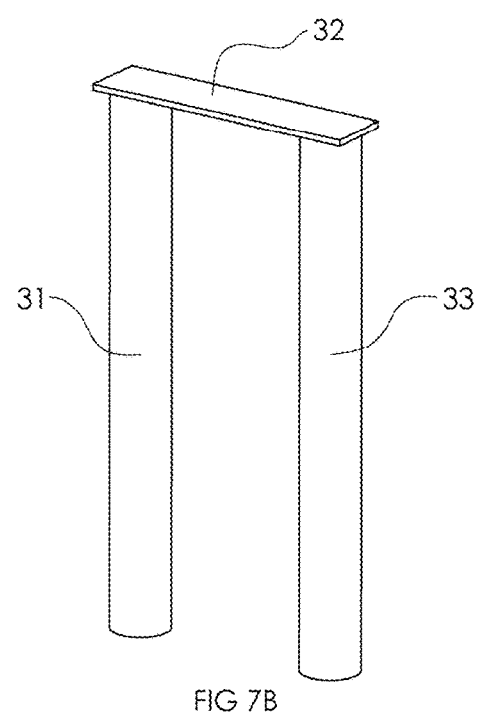
Figure 7C:
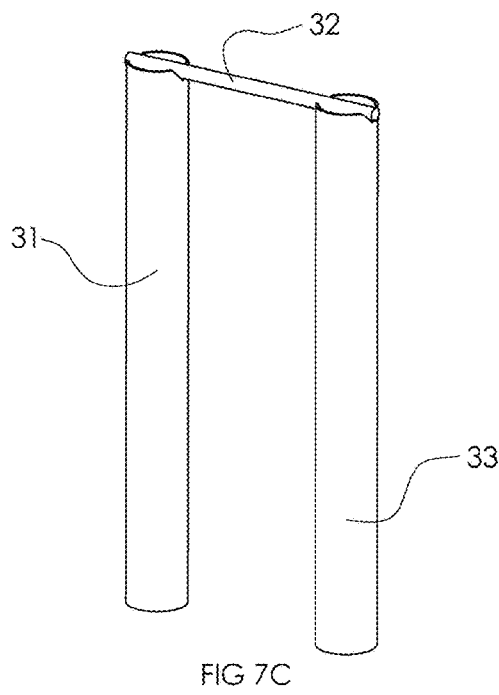

While a 50 mm diameter tubular filament of about 2 mm wall thickness is described, larger and smaller diameters and larger and smaller wall thicknesses are within the scope of the invention. For example, a useful range of wall thicknesses for filaments according to the invention is from about 1 mm to 6 mm, or more usefully, from about 1.75 to 3.5 mm, as indicated by FIG. 6. A useful range of tubular filament diameters is from about 10 mm and up, practically limited by tube cost and reactor size.

For using large surface area, shaped silicon filaments with electrical properties similar to a conventional slim rod filament, in a reactor otherwise suitable for using conventional slim rods, only the electrode studs, generally consisting of graphite, need to be modified or replaced, to provide a configuration suitable for holding the new filaments with the required electrical contact. In one embodiment, the length of the silicon filament is divided into sections or segments, such as illustrated segments 31, 32, 33, which are connected mechanically at their intersecting points to form an inverted U-shaped hair pin, with the horizontal bridge segment 32 sitting in a groove or a key slot at the top of the each vertical segment 31, 33. Another way to connect the shaped silicon bodies to form a inverse U-shaped is to use components made of silicon or pure graphite to interconnect the different segments. Other means of making a suitable mechanical and electrical connection between vertical and bridging segments of a filament of the invention are within the scope of the invention. This inverted U-shaped filament structure is mounted to the electrode studs and connected so as to provide a current path between a pair of electrical feedthroughs 19. During the CVD process, existing power supplies are used in the conventional manner to heat the filaments; polysilicon deposit 41 accumulates uniformly on the exposed surface of the silicon filament; the deposit layer being shown here partially removed to expose the silicon filament structure.

The silicon filament shapes can be uniform or non uniform in cross section and shape over its length, and may include but not be limited to silicon tubes, silicon ribbons, or elongate silicon bodies with other cross-sections, such as illustrated in the profiles or different cross sections in FIGS. 3A - 3D. The main principle is that the starting silicon filaments have a significantly larger surface area for silicon deposition than a solid core slim rod, with similar electrical properties. The relatively shorter bridge segment may be a solid rod in the order of a slim rod, so long as the relatively longer vertical segments have the desired larger surface area geometry described, and the total filament resistance is correct. This will allow direct replacement of slim rods currently used with silicon filaments proposed and achieve higher throughput without making other changes in equipment or operation.

Referring again to FIGS. 3A-3D, there are illustrated respectively a silicon tube, a silicon ribbon, a silicon member with a cross or X-shaped cross section, and a silicon member with a star-shaped cross section. These are illustrative only, and not limiting of the large surface area cross sections that may be used.

Referring again to FIGS. 4A, 4B and 5, the optimal size of a starting tubular filament, in particular the outer diameter and wall thickness, is determined by several factors, including the availability of the tube size, the cost of the filaments, the uniformity of the heating of a filaments, the required deposition rate (in terms of mm/hour), the process downtime, and of course, the market value of the polysilicon product. Generally, the larger the starting filament diameter, the higher the cost of the filament, and the more difficult it is to heat the filaments uniformly. The slower the growth rate, or the lower the downtime, the more benefit a larger diameter starting tube filament provides. It is important to point out that there is an optimal outer diameter for a starting silicon tube filaments depending on the growth rate and the downtime, as is illustrated in FIG. 4A.

It is useful to compare the results using a conventional CVD reactor with 18 U-shaped slim rods and an average deposition rate of 13.6 microns per minute with trichlorosilane and hydrogen mixture, to the production levels afforded by the invention. The graph of FIG. 4A shows the silicon production per year (metric tons per year) as a function of the outside diameter (OD) of the starting filament in accordance with the invention, in this case a tube, when such filaments replace the prior art solid slim rods in the conventional CVD reactor. FIG. 4A also illustrates the growth time in hours and the effect of the down time required between cycles, on the total production yield. Curves a, b, c, d, and e represent the yield curves for operations having downtimes of, respectively, 24, 12, 8, 6, and theoretically 0 hours downtime between, CVD cycles. Referring to FIG. 4B, there is illustrated an exemplary silicon filament 31 of a tubular geometry, with an initial 2 mm wall thickness and 50 mm OD, which after a full CVD cycle has grown a silicon deposit 41 to the finished final diameter $D_F$ of 120 mm.

Data of the type illustrated in FIG. 4A would show that for a conventional 7 mm diameter solid slim rod, the growth time is more than 70 hours and the reactor produces less than 231 metric tons per year when the down time between operating cycles was limited to 6 hours. When the solid slim rods are replaced with 50 mm OD tube filaments of the invention, the growth or CVD times are expected to be about 45 hours. Using the same 6 hour down time curve d for the calculation, 304 metric tons of polysilicon can be produced per year. As can be seen, the use of a 50 mm OD tubular starting filament in accordance with the invention yields about 30% more in throughput under the normal downtime of about 6 hours.

In a conventional CVD reactor higher growth rates can result in gas entrapment in the deposited silicon which leads to problems in the subsequent step of crystal growth by the Czochralski process for microelectronic applications. If the initial surface area of the filament is larger as taught herein, higher deposition rates can be initiated and increased without gas entrapment. For photovoltaic applications after polysilicon production, the subsequent step is usually multicrystalline ingot growth by a heat exchanger method (HEM) or directional solidification system (DSS) for which minor gas entrapment in silicon is not a problem, enabling yet faster deposition rates. Faster polysilicon deposition rates and greater overall production yields will result in significantly lower costs of production which is very important for the photovoltaic industry.

For the microelectronic applications the purity of polysilicon produced has to be very high, less than 1 part per billion total metallic impurities. In contrast, a silicon wafer for solar cells has a more relaxed requirement of less than 1 part per million total metallic impurities, three orders of magnitude more impurities. In fact, most of the silicon for solar cell applications is intentionally doped with boron (B) to about 0.5 parts per million atomic prior to fabricating solar cells. Therefore, polysilicon production for photovoltaic applications is able to utilize filaments of the invention similarly doped with boron or other suitable dopants; and the resultant low resistivity aids the direct resistive heating of the filaments during initial stages of the polysilicon deposition. This eliminates the requirement of a complex array of subsystems and two power sources; one power supply that can provide very high voltage and low current, and a second power supply that can sustain a very high current at relatively lower voltage plus the associated switching circuit.

The two power supplies and related switching circuitry can be replaced with a simple system of current supply and temperature controls. This change in design will result in lower capital equipment costs for new reactors of similar design, and for retrofit of existing reactors when required. This change and type of operation avoids cumbersome and time consuming start up procedures, lowers down time and increases productivity, for applications where the resulting purity level is acceptable.

The present invention is not restricted to CVD reactors using polysilicon deposition involving reaction of trichlorosilane but can be used for reactions involving silane, dicholosilane, or other derivatives or combinations of gases; by replacing solid slim rods with large surface area geometries and similar electrical resistivity properties in accordance with the invention.

While tubular filaments are preferred over other variations of large surface area filaments, the invention is not limited to tubular filament shapes. Referring to FIG. 5, there is illustrated a method and apparatus for making the FIGS. 3A-B silicon filament shapes and other large surface area shapes of suitable cross section in accordance with the invention. The method is generally described as the EFG (Edge-defined, film fed growth) method. One embodiment of this aspect of the invention consists of a silicon melt pool 54, contained in a graphite or quartz crucible 53. The melt is heated with a resistive or induction heater 55, and replenished with a silicon feeder 56, by feeding silicon solid or liquid 57 continuously. The silicon shape 51 crystallized out of the shaping die 52 is the stock from which filament sections of the invention are taken. The shaping die material can be graphite or quartz. Other variations of this apparatus and method are within the scope of the invention.

In another aspect of the invention, producing the FIGS. 3A-3D and other silicon filament shapes of the invention consists of using an EFG system with multiple shaping dies 52 feed by a common melt pool 54, where the dies may be of the same or different filament cross section geometries. Filament wall thickness tolerances can generally be held to within 10% of the target thickness in the axial direction. Such variation in the tube thickness will be evened out during the CVD deposition process because the thin section of the tube will have slightly higher temperature than that of a thicker section, and the higher temperature will result in a faster growth of silicon in that area. This self-compensation phenomenon is also observed in the CVD process using conventional slim rod filaments.

One example of the invention is a CVD reactor for bulk production of polysilicon consisting of a base plate system that might for example be one plate or a pair of opposing plates, configured with filament supports, and an enclosure attachable to the base plate system so as to form a deposition chamber. There is at least one silicon filament disposed within the chamber on the filament supports, and an electrical current source connectible to both ends of the filament via electrical feedthroughs in the base plate system, for heating the filament. There is at least one gas inlet in the base plate system connectible to a source of silicon-containing gas, and a gas outlet in the base plate system whereby gas may be released from the chamber.

The filament has a tubular cross section with an outer diameter of at least 20 mm and a ratio of wall thickness to diameter of not greater than ¼. The starting diameter may be other or greater than 20 mm, for example it may be in the range of 20-100 mm, and the wall thickness may range according. Alternatively, a tubular filament may have a starting outer diameter in the range of 40-80 mm, and a wall thickness in the range of 1.75-6 mm. One tubular embodiment may have a starting diameter of about 50 mm and a starting wall thickness of about 2 mm. The filament may be doped with at least one element from one of groups 3 and 5 of the Periodic Table, whereby its impedance at room temperature is reduced to less than in the order of $10^3$ ohm.cm.

Another example of the invention is a method for making and using large surface area filaments in a CVD reactor for the production of polysilicon, consisting of heating silicon in a silicon melt pool to a molten state, and growing with the silicon in a molten state by an EFG method with a die, a silicon structure consisting of a cross section with an outer circumference of greater than 60 mm and an impedance to the flow of electrical current ranging from in the order of $10^6$ ohm.cm at room temperature to 0.01 ohm.cm at 1200 deg C; then disposing at least one segment of the silicon structure between two electrodes within a CVD reactor so that it can function as a filament. Then heating the filament with electrical current and conducting a CVD process with a silicon-containing gas so that the filament receives a deposit of silicon. The die may be a multi-cavity die. There may be doping of the silicon structure so as to reduce the impedance at room temperature to less than in the order of $10^3$ ohm.cm.

Yet another example of the invention is a method for producing polysilicon consisting of using a silicon-containing gas and a CVD reactor, disposing in the CVD reactor a tubular silicon filament having an outer diameter in the range of 40 to 60 mm and a wall thickness in the range of 1.75 to 6 mm, and conducting a CVD process with the silicon-containing gas wherein the tubular silicon filament is heated by electrical current so that it receives a growing deposit of silicon until the CVD process is terminated.

Other and various examples and embodiments of the invention will be readily apparent to those skilled in the art from the description, figures, and claims that follow.

The invention claimed is:

1. A high surface area silicon filament configured for bulk deposition thereupon of polysilicon in a CVD reactor, the CVD reactor including a power supply adjusted and configured for deposition of polysilicon onto a solid, cylindrical, 7 mm diameter silicon slim rod, said slim rod having a specified slim rod length and a specified slim rod surface area, wherein:
   the filament has a filament length that is approximately equal to the specified slim rod length;
   and the high surface area silicon filament has a surface area greater than the slim rod surface area, while also being usable in the CVD reactor in place of the slim rod without adjusting, reconfiguring, or replacing the power supply of the CVD reactor.

2. The high surface area silicon filament of claim 1, wherein the high surface area silicon filament has a wall thickness that is axially uniform throughout the silicon filament to within a tolerance of 10%.

3. The high surface area silicon filament of claim 1, wherein the high surface area silicon filament includes an annular tube section having an outer diameter of at least 20 mm and a ratio of tube wall thickness to outer diameter of not greater than ¼.

4. The high surface area silicon filament of claim 1, wherein the high surface area silicon filament comprises two vertical filament segments electrically connected by a bridge segment.

5. The high surface area silicon filament of claim 1, wherein the high surface area silicon filament includes a horizontal tubular filament bridge segment.

6. The high surface area silicon filament of claim 1, wherein the high surface area silicon filament has an annular cross section having an outer diameter and a wall thickness, and the high surface area silicon filament satisfies the formula $$4(d_o-\delta)\delta \geq d_o d_{slim},$$

where
   $d_o$ is the outer diameter of the high surface area silicon filament,
   $\delta$ is the wall thickness of the high surface area silicon filament, and
   $d_{slim}$ is a diameter of the slim rod.

7. A CVD reactor for bulk production of polysilicon, said CVD reactor being configured for depositing polysilicon onto a solid, cylindrical, 7 mm diameter silicon slim rod having a specified slim rod length and a specified slim rod surface area, the CVD reactor comprising:
   a base plate system including filament supports;
   an enclosure attachable to said base plate system so as to form a deposition chamber;
   a power supply adjusted and configured for use with the cylindrical slim rod filament;
   electrical feedthroughs in said base plate system, said electrical feedthroughs being adapted for connection of the power supply to both ends of a high surface area silicon filament;
   a gas inlet in said base plate system connectible to a source of silicon-containing gas;
   a gas outlet in said base plate system whereby gas may be released from said chamber; and
   wherein
   said high surface area silicon filament has a total surface area that is at least four times greater than a total surface area of said slim rod;
   said high surface area silicon filament has a filament length that is approximately equal to the specified slim rod length; and
   said high surface area silicon filament is usable in the CVD reactor without adjusting, reconfiguring, or replacing the power supply of the CVD reactor.

8. The CVD reactor of claim 7, wherein the high surface area silicon filament has a wall thickness that is axially uniform throughout the silicon filament to within a tolerance of 10%.

9. The CVD reactor of claim 7, wherein the high surface area silicon filament includes an annular tube section having an outer diameter of at least 20 mm and a ratio of tube wall thickness to outer diameter of not greater than ¼.

10. The CVD reactor of claim 7, wherein the high surface area silicon filament comprises two vertical filament segments electrically connected by a bridge segment.

11. The CVD reactor of claim 7, wherein the high surface area silicon filament includes a horizontal tubular filament bridge segment.

12. The CVD reactor of claim 7, wherein the high surface area silicon filament has an annular cross section having an outer diameter and a wall thickness, and the silicon filament satisfies the formula $$4(d_o-\delta)\delta \geq d_o d_{slim},$$

where
   $d_o$ is the outer diameter of the high surface area silicon filament,
   $\delta$ is the wall thickness of the high surface area silicon filament, and
   $d_{slim}$ is a diameter of the slim rod.

* * * * *